United States Patent
Tanabe

(10) Patent No.: US 10,848,048 B2
(45) Date of Patent: Nov. 24, 2020

(54) SLOPE COMPENSATION WITH ADAPTIVE SLOPE

(71) Applicant: Dialog Semiconductor (UK) Limited, London (GB)

(72) Inventor: Hirohisa Tanabe, Yokohama (JP)

(73) Assignee: Dialog Semiconductor (UK) Limited, London (GB)

( * ) Notice: Subject to any disclaimer, the term of this patent is extended or adjusted under 35 U.S.C. 154(b) by 265 days.

(21) Appl. No.: 15/718,030

(22) Filed: Sep. 28, 2017

(65) Prior Publication Data

US 2019/0097518 A1    Mar. 28, 2019

(51) Int. Cl.
| | |
|---|---|
| *H02M 1/08* | (2006.01) |
| *H02M 3/158* | (2006.01) |
| *H03K 5/12* | (2006.01) |
| *H02M 3/156* | (2006.01) |
| *H02M 1/00* | (2006.01) |

(52) U.S. Cl.
CPC .............. *H02M 1/08* (2013.01); *H02M 3/156* (2013.01); *H02M 3/158* (2013.01); *H03K 5/12* (2013.01); *H02M 2001/0025* (2013.01)

(58) Field of Classification Search
CPC ........ H02M 1/08; H02M 3/156; H02M 3/158; H02M 3/33507; H02M 2001/0025; H02M 2001/0032; H03K 4/502; H03K 5/12; H03K 6/04; H03K 7/06
See application file for complete search history.

(56) References Cited

U.S. PATENT DOCUMENTS

| | | | |
|---|---|---|---|
| 4,672,518 A | 6/1987 | Murdock | |
| 4,837,495 A | 6/1989 | Zansky | |
| 7,425,819 B2 | 9/2008 | Isobe | |
| 8,138,740 B2 | 3/2012 | Yuan | |
| 9,312,844 B2 * | 4/2016 | Darmawaskita | ....... H03K 4/502 |
| 2006/0043951 A1 | 3/2006 | Oswald et al. | |
| 2007/0200633 A1 | 8/2007 | Chen et al. | |
| 2007/0296389 A1 | 12/2007 | Chen et al. | |
| 2009/0122578 A1 | 5/2009 | Beltran | |
| 2009/0160416 A1 | 6/2009 | Kawagishi et al. | |

(Continued)

FOREIGN PATENT DOCUMENTS

WO    WO 2016207760    12/2016

OTHER PUBLICATIONS

"Understanding non-linear slop-compensation: a graphical analysis," by Greg Smith, National Semiconductor, Slope Compensation, CMC Circtuits, EE Times-India, Nov. 2007, eetindia.com, pp. 1-5.

(Continued)

*Primary Examiner* — Matthew V Nguyen
(74) *Attorney, Agent, or Firm* — Saile Ackerman LLC; Stephen B. Ackerman

(57) ABSTRACT

The disclosure provides for a slope voltage compensation circuit with an adaptive slope compensation method, in a DC-DC switching converter operating in current control mode, at duty cycles greater than 50%. The proposed solution allows for the dynamic range of useful operation to be extended, lowering the slope voltage compensation at the beginning of the cycle, and then increasing the compensation as 50% duty cycle is achieved. This method is based on voltage control instead of time, and a second phase of a clock is not required.

18 Claims, 4 Drawing Sheets

(56) References Cited

U.S. PATENT DOCUMENTS

| | | |
|---|---|---|
| 2009/0237058 A1 | 9/2009 | Mulligan et al. |
| 2010/0253313 A1 | 10/2010 | Herzer et al. |
| 2011/0187342 A1 | 8/2011 | Yuan |
| 2012/0249106 A1 | 10/2012 | Wu |
| 2013/0043856 A1* | 2/2013 | Wang .................... H02M 3/156 323/288 |
| 2014/0132236 A1 | 5/2014 | Darmawaskita et al. |
| 2014/0239925 A1 | 8/2014 | Tanabe et al. |
| 2014/0239935 A1 | 8/2014 | Nene |
| 2014/0266110 A1 | 9/2014 | Yuan et al. |
| 2015/0200593 A1 | 7/2015 | Stoichita et al. |

OTHER PUBLICATIONS

"Design of a Novel Nonlinear Slope Compensation Circuit for Peak Current-mode Boose DC-DC Converter," by Chaodong Ling et al., 2010 International Conference on Anti-Counterfeiting Security and Identification in Communication (ASID), Jul. 18-20, 2010, pp. 63-66.

"Modeling and Loop Compensation Design of Switching Mode Power Supplies," by Henry J. Zhang, Linear Technology, Application Note 149, Jan. 2015, pp. 1-22.

"Compensation Design for Peak Current-Mode Buck Converters," Applicaiton Note AN028—Apr. 2014, Copyright 2014 Richtek Technology Corporation, pp. 1-13.

\* cited by examiner

SLOPE COMPENSATION WITH ADAPTIVE SLOPE

BACKGROUND

Field

The disclosure relates generally to current mode DC-DC switching converters, operating at greater than 50% duty cycle.

Description

Modern electronic devices typically use power conversion circuits to provide regulated voltage supplies to various circuits. One type of power conversion is a DC-to-DC switching converter. They are typically configured to periodically transmit energy from an energy source, such as a battery, to an energy load that requires a specific output voltage or current. DC-to-DC switching converters usually employ pulse width modulation (PWM), to transfer an amount of energy proportional to a pulse width through an electronic switch from the energy source to the energy load, to maintain a desired output voltage or current, even as the energy source and energy load fluctuate. Regulation is achieved by modulating the pulse width to adjust how much energy is transferred in each period.

A DC-to-DC switching converter configured to implement PWM typically includes one or more MOS switches, an inductor, a feedback system that samples the output voltage and/or current in the switches, and control circuitry. The feedback system may use sampled voltages for feedback, and/or sampled currents.

A current mode DC-to-DC switching converter includes a feedback system that uses both sampled voltages and sampled currents. Voltage sampling compares the output voltage with a reference voltage to generate an error voltage that is proportional to the difference between the output voltage and reference voltage. Current sampling compares the instantaneous current flowing in the inductor with the error voltage to determine a duty-cycle for the power switch.

Current mode DC-DC switching converter designs can suffer from instability when the duty cycle of the pulse-width-modulation signal (PWM), used to set the output voltage, rises above 50%. To overcome this instability, a technique called slope compensation is used to restore reliable operation across the whole PWM duty-cycle range.

Slope compensation is implemented by summing a negative saw tooth ramp voltage with an amplified voltage at the control input of a comparator, or summing a positive saw tooth ramp voltage with the voltage of an inductor current as seen across a sense resistor. For ideal compensation, the compensation ramp has a slope equal to exactly half the downslope of a voltage waveform at the other comparator input, the voltage of an inductor current as seen across a sense resistor.

FIG. 1 illustrates slope compensation waveform 100, of a first prior art. Slope voltage (V) compensation 110 is represented vs time (us), for a large dynamic range of a DC-DC switching converter. A large dynamic range indicates a high duty cycle case, for example a low input voltage and a high output voltage, of a DC-DC switching converter. The slope voltage of the PWM signal is generated with a fixed frequency proportional to a control voltage. This determines the percentage of time the switching element conducts, and therefore the output voltage.

FIG. 2 shows slope compensation circuit configuration 200, of the prior art of FIG. 1. The prior art slope compensation circuit comprises DC current source 210 into capacitor 220. Switch 230, when closed, shorts the terminals of the capacitor at the output. The configuration and sequence creates fixed slope voltage compensation, and a large dynamic range is consumed at higher duty cycles. For Boost DC-DC switching converters, higher duty cycles occur with low input voltages and high output voltages, and if the input voltage supplies a control block, the dynamic range of the switching converter narrows.

FIG. 3 illustrates slope compensation waveform 300, of a second prior art. This is the case where the starting point of slope voltage compensation 310 is not at the beginning of the period, but just before the half period point, because the compensation is not necessary for less than 50% duty cycle. Here, a smaller dynamic range is consumed, because during the first half period the slope voltage signal is flat. Note that timing clock 320 is needed to trigger the slope compensation. This clock may be the root cause of undesirable coupling, and in the worst case, the LX node of the inductor terminal may switch with the clock, at a time much earlier than what is targeted.

SUMMARY

An object of the disclosure is to provide a slope compensation circuit, with an adaptive slope method, in a DC-DC switching converter.

A further object of the slope compensation circuit is to improve the dynamic range of a DC-DC switching converter, for low input voltage and longer duty cycles, for example in a Boost switching converter.

Still further, another object of the adaptive slope method is to provide a shallow slope voltage at lower duty cycles, and a steeper slope compensation at higher duty cycles, for a more stable behavior and faster response.

To accomplish the above and other objects, a slope compensation circuit for a DC-DC switching converter is disclosed. In a first embodiment the circuit comprises a first capacitor, and a current source into the first capacitor, at the drain of a first transistor. A switch is connected across the first capacitor, to create an adaptive slope on the voltage. The first embodiment further comprises a second capacitor, and a voltage reference. The gate of the first transistor is connected to the voltage reference, and the source of the first transistor is connected to the second capacitor. In a second embodiment the circuit comprises a first capacitor, and a first current source into the first capacitor, at the drain of a first transistor. A switch is connected across the first capacitor, to create an adaptive slope on the voltage. The second embodiment further comprises a second capacitor, and a voltage reference. The gate of the first transistor is connected to the voltage reference via the second transistor, and the source of the first transistor is connected to the second capacitor. The second embodiment further comprises a second current source, at the drain of a second transistor. The source of the second transistor is connected to the voltage reference, and its gate is connected to its drain, also the gate of the first transistor.

The above and other objects are further achieved by a method for adaptive slope compensation in a DC-DC switching converter. The steps include providing a slope compensation circuit, comprising a first capacitor coupled to a current source, and a second capacitor coupled to the first capacitor, via a transistor. The steps also include creating a compensation signal, comprising a first linear portion having a first slope, and a second linear portion having a second slope. The steps also include using a voltage to control the first and the second slopes. The steps also include establishing the first slope less than the second slope.

In various embodiments the function may be achieved using MOS devices for the first and second transistors.

DETAILED DESCRIPTION

The present disclosure provides a slope compensation circuit, in a DC-DC switching converter operating in current control mode, with adaptive slope compensation for duty cycles greater than 50% to control cycle oscillations. The proposed solution allows the dynamic range of useful operation to be extended by lowering the slope voltage at the beginning of the cycle, until 50% duty cycle is achieved, and then the slope voltage is increased. This method is formed based on a voltage instead of a time, and so a second phase of a clock is not required for operation.

A two-capacitor solution is presented, where a first capacitor is coupled to a current source for providing a current, and a second capacitor is coupled to the first capacitor via a single transistor. The transistor comprises a first terminal coupled to the first capacitor, a second terminal coupled to the second capacitor, and a third terminal coupled to a reference voltage. A compensation signal comprises a first linear portion having a first slope, and a second linear portion having a second slope. The first and second slopes depend on a voltage between the second terminal and the third terminal of the transistor, and the first slope is less than the second.

Figure 1:
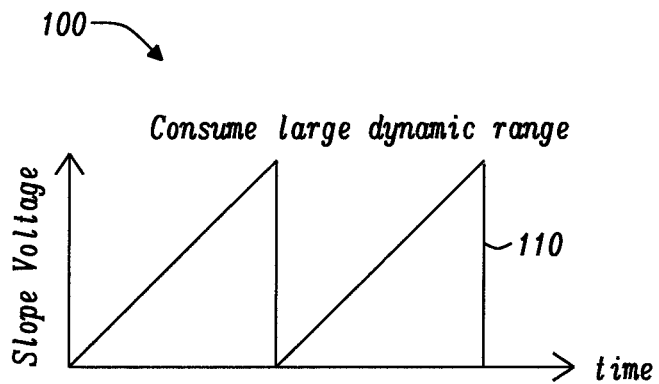
FIG. 1 illustrates a slope compensation waveform, of a first prior art.
Figure 2:
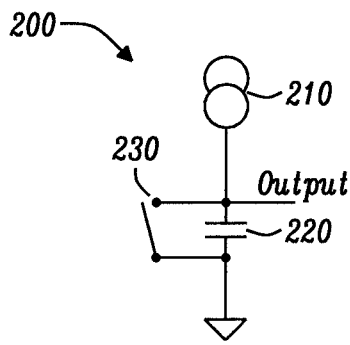
FIG. 2 shows a slope compensation circuit configuration, of the prior art of FIG. 1.
Figure 3:
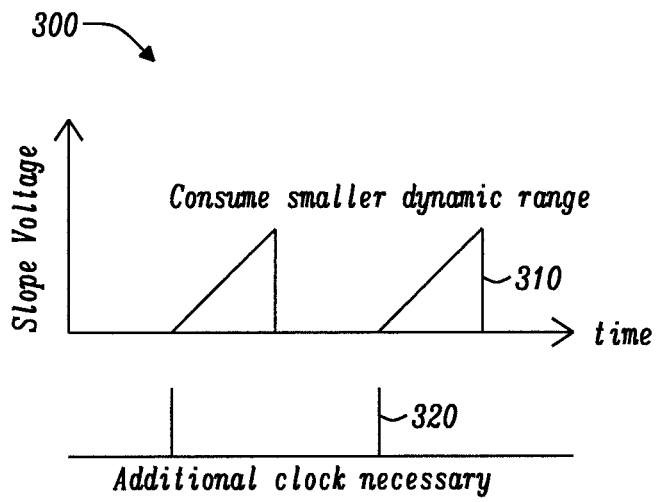
FIG. 3 illustrates a slope compensation waveform, of a second prior art.
Figure 4:
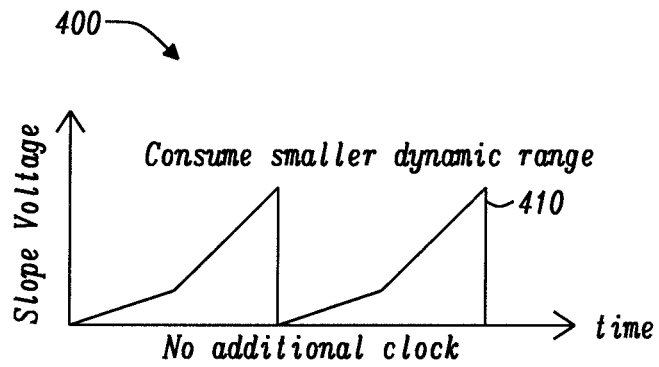
FIG. 4 illustrates a slope compensation waveform, of the present disclosure.

FIG. 4 illustrates slope compensation waveform 400, of the present disclosure. As compared to FIG. 1, slope voltage compensation 410 is shallower at the beginning of the period, and as compared to FIG. 3 no additional clock is required. After some delay, to achieve the target slope for duty cycles greater than 50%, the slope voltage becomes steeper.

Figure 5:
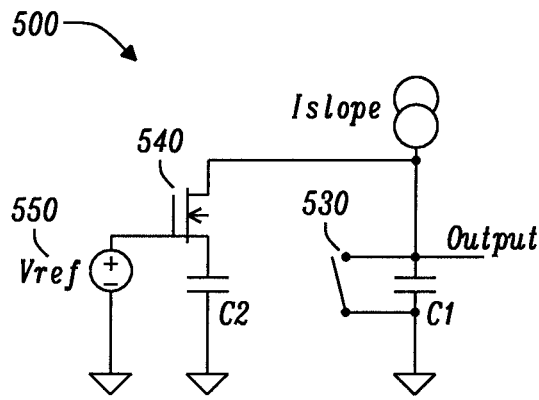
FIG. 5 shows a first embodiment of a slope compensation configuration circuit, of the disclosure.

FIG. 5 shows first embodiment slope compensation configuration circuit 500, of the disclosure. The circuit comprises first capacitor C1, and current source Islope into the first capacitor, at the drain of first transistor 540, where the first transistor can be a MOS device. Switch 530, connected across the first capacitor at the output, creates an adaptive slope on a voltage compensation signal. The first embodiment further comprises second capacitor C2, and voltage reference Vref. The gate of the first transistor is connected to the voltage reference, and the source of the first transistor is connected to the second capacitor.

Initially, current source Islope flows into capacitors C1 and C2. As the gate-source voltage Vgs of the first transistor becomes smaller, current in additional capacitor C2 decreases, and finally no current flows when Vgs becomes less than a threshold voltage Vth. From this point, the current source flows only into original capacitor C1, and the slope voltage becomes steeper, as in the prior art. It can be seen that the first linear portion of the voltage compensation signal has a slope less than the second linear portion of the signal. In this way, the slopes of the first and second linear portions depend on the voltage between the gate and source terminals of the first transistor.

The timing of the current flow in additional capacitor C2 can be controlled by the capacitance values of C1 and C2. The current flow is also controlled by the threshold voltage between the gate and source terminals of the first transistor Vth, the current source Islope, and the voltage reference Vref. As a first order approximation, the changing time of the current flow, Tchg, is modeled by the following equation:

$$Tchg=((C1+C2)/Islope)(Vref-Vth)$$

If the reference voltage Vref is changed to Vref'+Vth, the voltage between the gate and source terminals of the first transistor, Vth, can be cancelled.

Figure 6:
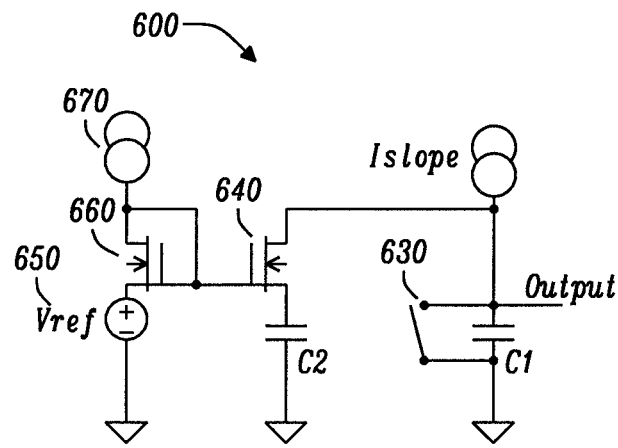
FIG. 6 illustrates a second embodiment of a slope compensation configuration circuit, where a voltage reference is now achieved with a compensated voltage reference.

FIG. 6 shows second embodiment 600 of a slope compensation configuration circuit, where the voltage reference Vref is now achieved with a compensated voltage reference Vref'+Vgs. Here, Vgs is close to Vth. The circuit comprises first capacitor C1, and first current source Islope into the first capacitor, at the drain of first transistor 640, where the first transistor can be a MOS device. Switch 630, connected across the first capacitor at the output, creates an adaptive slope on the voltage compensation signal. The second embodiment further comprises second capacitor C2 and a compensated voltage reference Vref' The gate of the first transistor is connected to virtual reference Vref=Vref'+Vgs, and the source of the first transistor is connected to the second capacitor. The second embodiment further comprises second current source 670, at the drain of second transistor 660, where the second transistor can be a MOS device. The source of the second transistor is connected to the voltage reference Vref', and its gate is connected to its drain, also the gate of the first transistor as the virtual compensated reference Vref.

Figure 7:
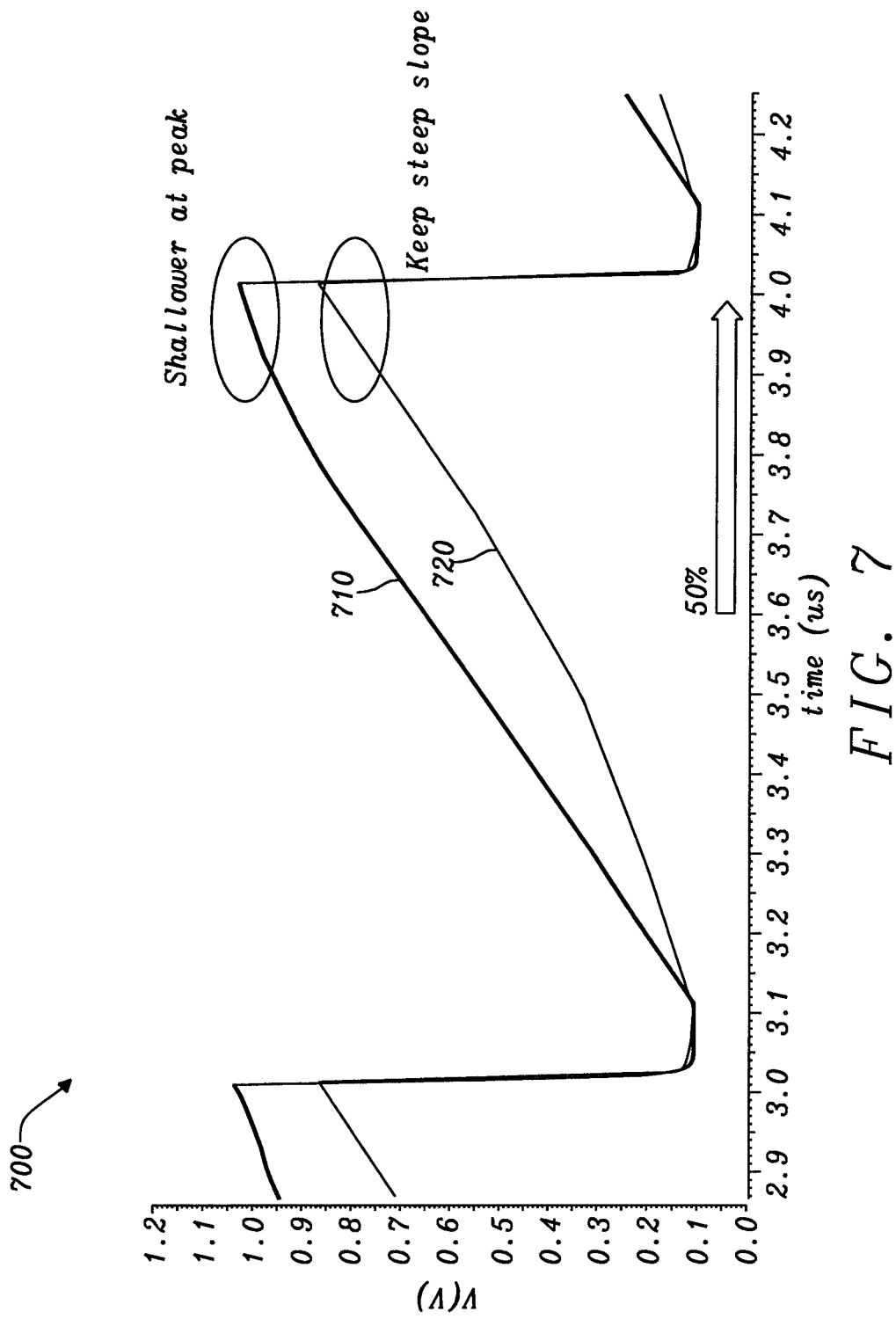
FIG. 7 illustrates simulation results for the slope compensation waveform of the disclosure, compared to the prior art.

FIG. 7 illustrates simulation results 700 for slope compensation waveform 720 of the disclosure, compared to prior art 710. It shows how the dynamic range can now be preserved at the peak, and the steep slope of the voltage compensation kept with the disclosure. Because of an insufficient dynamic range, the slope of the prior art becomes shallower at the peak. As compared to FIGS. 1 & 3, new slope voltage compensation 720 is shallower at the beginning of the period without any additional clock. After some delay, it achieves the target slope at more than 50% duty cycle, and the slope voltage compensation becomes steeper.

Figure 8:
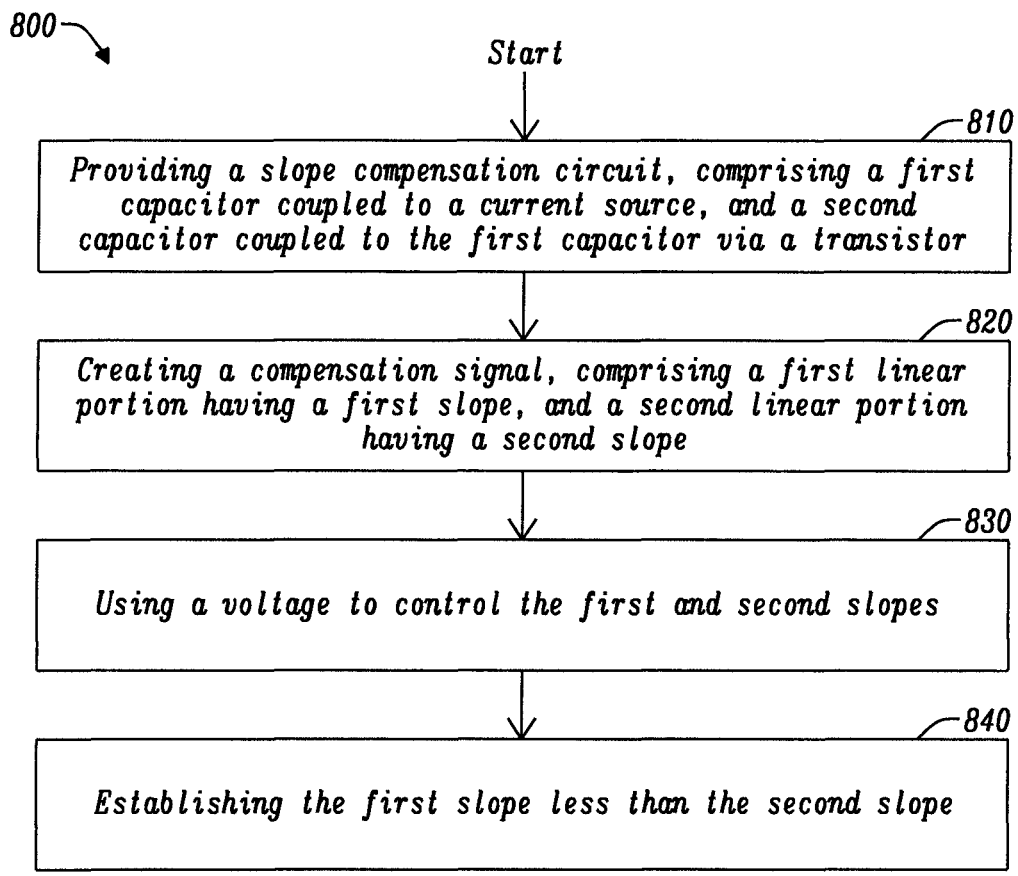
FIG. 8 is a flow chart of a method for adaptive slope compensation in a DC-DC switching converter.

FIG. 8 is flow chart 800 of a method for adaptive slope compensation, in a DC-DC switching converter. The steps include 810, providing a slope compensation circuit, comprising a first capacitor coupled to a current source, and a second capacitor coupled to the first capacitor, via a transistor. The steps also include 820, creating a compensation signal, comprising a first linear portion having a first slope, and a second linear portion having a second slope. The steps also include 830, using a voltage to control the first and the second slopes. The steps also include 840, establishing the first slope less than the second slope.

The advantages of one or more embodiments of the present disclosure include providing an adaptive slope method for a DC-DC switching converter, compared to a fixed slope method of the prior art. The disclosure allows for a shallow slope voltage at lower duty cycles, and a steeper compensation at higher duty cycles, providing a more stable behavior and fast response.

While this invention has been particularly shown and described with reference to the preferred embodiments thereof, it will be understood by those skilled in the art that various changes in form and details may be made without departing from the spirit and scope of the invention.

The invention claimed is:

1. A slope compensation circuit, in a DC-DC switching converter, comprising:
    a first capacitor coupled to a current source, wherein said current source is configured to provide a charge current;
    a second capacitor coupled to said first capacitor via a first transistor, wherein said first transistor comprises a drain coupled to said first capacitor, a source coupled to said second capacitor and a gate coupled to a reference voltage; and
    a switch, connected across said first capacitor, configured to create an adaptive slope on a voltage compensation signal, wherein said voltage compensation signal comprises a first linear portion having a first slope, and a second linear portion having a second slope, where said first slope is less than said second slope.

2. The circuit of claim 1, wherein said first and second slopes depend on a voltage between said source terminal and said gate terminal of said first transistor.

3. The circuit of claim 2, wherein a dynamic range of operation of said DC-DC switching converter is extended by lowering said voltage between said source terminal and said gate terminal of said first transistor at a beginning of a cycle, until 50% duty cycle is reached.

4. The circuit of claim 3, wherein a second phase of a clock is not required for said dynamic range of operation of said DC-DC switching converter.

5. The circuit of claim 1, wherein a timing of a current flow in said second capacitor can be controlled by values of said first and said second capacitors, said voltage between said source terminal and said gate terminal of said first transistor, said current source, and said reference voltage.

6. The circuit of claim 1, wherein said reference voltage is a compensated reference voltage, wherein said compensated reference voltage includes said voltage between said source terminal and said gate terminal of said first transistor.

7. The circuit of claim 6, wherein a second current source is connected to a second transistor at a first terminal of said second transistor.

8. The circuit of claim 7, wherein a second terminal of said second transistor is coupled to a reference voltage and a third terminal of said second transistor is connected to said first terminal of said second transistor.

9. The circuit of claim 7, wherein said first terminal of said second transistor is connected to said third terminal of said second transistor, and to said gate terminal of said first transistor.

10. The circuit of claim 1, wherein said first transistor is a MOS device.

11. The circuit of claim 7, wherein said second transistor is a MOS device.

12. A method for adaptive slope compensation, in a DC-DC switching converter, comprising:
    providing a slope compensation circuit, comprising a first capacitor coupled to a current source, and a second capacitor coupled to said first capacitor, via a transistor, wherein said transistor comprises a drain coupled to said first capacitor, a source terminal coupled to said second capacitor and a gate coupled to a reference voltage;
    creating a voltage compensation signal, comprising a first linear portion having a first slope, and a second linear portion having a second slope;
    using a voltage to control said first and said second slopes; and
    wherein said first slope is less than said second slope.

13. The method of claim 12, wherein a dynamic range of operation of said DC-DC switching converter extends by lowering said voltage at a beginning of a cycle, until 50% duty cycle is reached.

14. The method of claim 12, wherein values of said first and said second capacitors, said voltage, and said current source control a timing of a current flow in said second capacitor.

15. The method of claim 12, wherein a compensated reference voltage includes a voltage between a source terminal and a gate terminal of said transistor.

16. The method of claim 12, wherein said method for adaptive slope compensation includes a second current source and a second transistor.

17. The method of claim 16, wherein a second terminal of said second transistor couples to a reference voltage and a third terminal of said second transistor connects to said first terminal of said second transistor.

18. The method of claim 16, wherein a first terminal of said second transistor connects to said third terminal of said second transistor, and to a gate terminal of said first transistor.

* * * * *